United States Patent
Ogawa et al.

(10) Patent No.: US 11,639,560 B2
(45) Date of Patent: May 2, 2023

(54) DEPOSIT REMOVING DEVICE AND DEPOSIT REMOVING METHOD

(71) Applicant: SUMCO CORPORATION, Tokyo (JP)

(72) Inventors: Fukuo Ogawa, Tokyo (JP); Takuya Yotsui, Tokyo (JP); Koichi Maegawa, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 17/620,559

(22) PCT Filed: May 28, 2020

(86) PCT No.: PCT/JP2020/021251
§ 371 (c)(1),
(2) Date: Dec. 17, 2021

(87) PCT Pub. No.: WO2020/255674
PCT Pub. Date: Dec. 24, 2020

(65) Prior Publication Data
US 2022/0267929 A1   Aug. 25, 2022

(30) Foreign Application Priority Data

Jun. 21, 2019   (JP) .............................. JP2019-115806

(51) Int. Cl.
*B08B 9/035*   (2006.01)
*C30B 35/00*   (2006.01)
(Continued)

(52) U.S. Cl.
CPC .............. *C30B 35/00* (2013.01); *B08B 9/035* (2013.01); *C30B 29/06* (2013.01);
(Continued)

(58) Field of Classification Search
CPC combination set(s) only.
See application file for complete search history.

(56) References Cited

U.S. PATENT DOCUMENTS 8,236,265 B2   8/2012   Hoshino et al.
8,461,487 B2   6/2013   Hoshino et al.
(Continued)

FOREIGN PATENT DOCUMENTS

JP   2002-305190 A   10/2002
JP   2003-124205 A    4/2003
(Continued)

OTHER PUBLICATIONS

International Preliminary Report on Patentability in International Application No. PCT/JP2020/021251, dated Dec. 21, 2021, along with an English translation thereof.
(Continued)

*Primary Examiner* — Erin F Bergner
(74) *Attorney, Agent, or Firm* — Greenblum & Bernstein, P.L.C.

(57) ABSTRACT

A deposit removing device disclosed herein removes a deposit that adheres to an exhaust pipe through which gas is exhausted from a chamber that manufactures a semiconductor crystal. The deposit removing device includes: a valve that opens and closes an exhaust outlet that communicates with the exhaust pipe; a sealing cover and a fixed table configured to store the valve, into which an inert gas is introduceable, and configured to isolate the exhaust outlet from the outside; and an exhaust outlet opening/closing portion that includes a cylinder for driving the valve and a cylinder for driving the sealing cover or the fixed table. The cylinder drives the valve to open and close the exhaust outlet, and the cylinder drives the sealing cover or the fixed table to introduce the atmosphere into the sealing cover.

6 Claims, 7 Drawing Sheets

(51) Int. Cl.
     *C30B 29/06*      (2006.01)
     *C30B 13/00*      (2006.01)
     *C30B 15/00*      (2006.01)

(52) U.S. Cl.
     CPC ......... *B08B 2209/032* (2013.01); *C30B 13/00* (2013.01); *C30B 15/00* (2013.01)

(56) References Cited

U.S. PATENT DOCUMENTS

| | | |
|---|---|---|
| 8,524,188 B2 | 9/2013 | Hoshino et al. |
| 2013/0306109 A1 | 11/2013 | Okita |
| 2015/0314338 A1* | 11/2015 | Morioka .................. G03F 7/30 137/861 |
| 2017/0314162 A1 | 11/2017 | Okita |

FOREIGN PATENT DOCUMENTS

| | | |
|---|---|---|
| JP | 2014-214051 A | 11/2014 |
| JP | 5644861 B2 | 12/2014 |
| TW | 201128001 A | 8/2011 |
| TW | 201245517 A | 11/2012 |
| WO | 2012/131888 A1 | 10/2012 |

OTHER PUBLICATIONS

International Search Report issued in International Patent Application No. PCT/JP2020/021251, dated Aug. 11, 2020, along with an English translation thereof.

Office Action issued in Taiwan Counterpart Patent Appl. No. 109108562, dated Dec. 21, 2020, along with an English translation thereof.

* cited by examiner

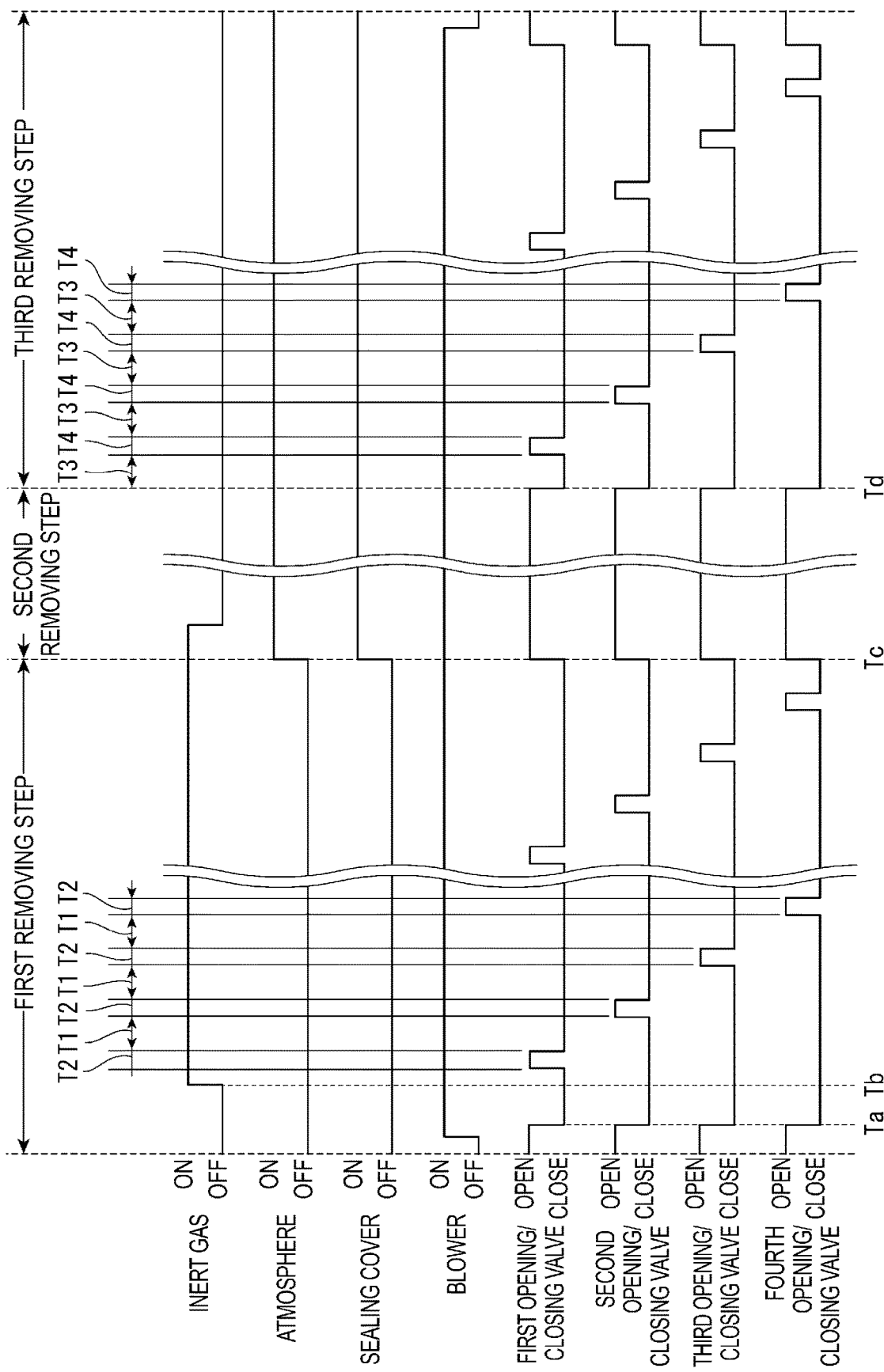

DEPOSIT REMOVING DEVICE AND DEPOSIT REMOVING METHOD

TECHNICAL FIELD

The present invention relates to a deposit removing device and a deposit removing method for removing a deposit that adheres to an exhaust pipe through which gas is exhausted from a chamber that manufactures a semiconductor crystal.

BACKGROUND ART

Semiconductor crystal manufacturing devices include a semiconductor crystal manufacturing device that manufactures a semiconductor crystal using a single crystal growing method, such as a Czochralski method (hereinafter abbreviated as a CZ method) or a Floating zone method (hereinafter abbreviated as a FZ method).

In the CZ method, for example, the semiconductor crystal is manufactured by pulling up monocrystalline silicon from a silicon melt melted by a quartz crucible provided in a chamber. In this manufacturing process, oxygen ($O_2$) is eluted from the quartz crucible containing silicon dioxide ($SiO_2$) and reacts with the silicon melt, generating silicon oxide ($SiO_x$) or silicon dioxide ($SiO_2$). The silicon oxide ($SiO_x$) or silicon dioxide ($SiO_2$) evaporates from a surface of the silicon melt. In the following, in some cases, the silicon oxide ($SiO_x$), the silicon dioxide ($SiO_2$), and dopants described below evaporated from the surface of the silicon melt are collectively referred to as an "evaporant (evaporating substance)".

In the silicon oxide ($SiO_x$), x takes a value satisfying $0<x<2$. The reason why the silicon oxide ($SiO_x$) is generated as follows. That is, oxygen ($O_2$) is insufficient compared to silicon molecules (S) in the silicon melt and an atmosphere in the chamber, and thus the silicon molecules (S) are not oxidized completely.

The evaporant reaches a wall surface of the chamber above the surface of the silicon melt, and part of the evaporant adheres thereto. The deposit may fall and be melted into the silicon melt. When the deposit melted into the silicon melt is taken or incorporated in the monocrystalline silicon being pulled up, a defect (e.g., dislocation) may be caused in the monocrystalline silicon manufactured.

In order to inhibit such an inconvenience, an inert gas is introduced from above the chamber while pressure into the chamber is normally maintained at a low pressure of thousands of Pa. Then, the evaporant is exhausted outside the chamber before the evaporant reaches the wall surface of the chamber. The semiconductor crystal manufacturing device thus includes: an intake pipe for introducing the inert gas in the chamber; an exhaust pipe for exhausting the inert gas from the chamber; a vacuum pump for exhausting the inert gas from the exhaust pipe; and the like. Here, examples of the inert gas include not only noble gas elements represented by argon (Ar) and helium (He) but also gases with low chemical reactivity represented by nitrogen ($N_2$).

The evaporant moving from the chamber having a high-temperature atmosphere to reach the exhaust pipe is gradually cooled while passing through the exhaust pipe. Although part of the evaporant is exhausted outside, the rest of the evaporant adheres to an inner wall surface of the exhaust pipe and is deposited thereon. In the following, in some cases, the silicon oxide ($SiO_x$), the silicon dioxide ($SiO_2$), and the dopants described below that adhere to the inner wall surface of the exhaust pipe are collectively referred to as a "deposit". The thickness of the deposit(s) on the inner wall surface of the exhaust pipe increases as the number of times of pulling-up of the monocrystalline silicon increases.

The deposits on the inner wall surface of the exhaust pipe may cause various problems described below.

(1) The deposits flow backwards into the chamber and are melted into the silicon melt, generating a defect (e.g., dislocation) in the monocrystalline silicon manufactured.

(2) The deposits make an inner diameter of the exhaust pipe small to increase pipe resistance of the exhaust pipe, making it difficult to control pressure in the chamber. The pressure in the chamber is thus likely to fluctuate greatly. This may adversely affect conditions for pulling the monocrystalline silicon, or the deposits peeling off the inner wall surface of the exhaust pipe may enter a device (e.g., vacuum pump) disposed downstream of the exhaust pipe and may damage the device.

(3) After completion of the pulling of the monocrystalline silicon, when the inside of the chamber is opened to the atmosphere or when the deposits are removed, oxygen ($O_2$) may be supplied rapidly to the silicon oxide ($SiO_x$) under oxidation. This may cause spontaneous combustion or dust explosion.

(4) When a large-diameter monocrystalline silicon is manufactured, an amount of silicon melt in the quartz crucible is larger than a case where a small-diameter monocrystalline silicon is manufactured. This makes the concentration of the evaporant in the exhaust pipe high. Thus, an amount of deposits adhering to the inner wall surface of the exhaust pipe is larger than the case where the small-diameter monocrystalline silicon is manufactured. This increases the possibility of the above (1) to (3) problems.

In order to solve the above problems, the applicant proposed the following deposit removing method before. This deposit removing method includes an atmosphere introduction step and an atmosphere exhaust step. In the atmosphere introduction step, the vacuum pump is stopped in the semiconductor crystal manufacturing device that has pulled up the monocrystalline silicon a predetermined number of times, and the inside of the chamber is opened to the atmosphere after the crucible is removed with the vacuum pump being stopped. This allows the atmosphere to flow into exhaust pipes, causing surface layers of the deposits on the inner walls of the exhaust pipes to combust.

Subsequently, opening/closing valves are fitted into a plurality of communication holes that pierce a base plate forming the bottom of the chamber and that communicate with the exhaust pipes. A suction pump provided in a system that is independent from the vacuum pomp is driven in a state where the opening/closing valves are opened. This causes the atmosphere to flow from the chamber to the exhaust pipes, which causes the deposits on the exhaust pipes to combust. The combusting substance peels off the exhaust pipes and are sucked by the suction pump.

In the atmosphere exhaust step, all the opening/closing valves are closed with the suction pump being driven, setting the inside of the exhaust pipes to negative pressure. Then, any one of the opening/closing valves is opened and closed. This causes pressure fluctuation, returning the pressure in the corresponding exhaust pipe to atmospheric pressure. The atmosphere is thus allowed to flow into the corresponding exhaust pipe, causing the deposit(s) remaining on the inner wall surface of the corresponding exhaust pipe to combust. Simultaneously, peeling force stronger than that in the atmosphere exhaust step is generated due to the pressure fluctuation, and thus the combusting substance(s) remaining on the inner wall surface of the corresponding exhaust pipe peel(s) off, and is/are sucked by the suction pump. The same processes are performed on any other exhaust pipes than the corresponding exhaust pipe (see, for example, Patent Literature 1).

CITATION LIST

Patent Literature(s)

Patent Literature 1: JP5644861B (claim 1, claims 7, [0008], [0014], [0016], [0020], [0023] to [0036], FIGS. 1 to 5)

SUMMARY OF THE INVENTION

Problem(s) to be Solved by the Invention

In order to give a desired property to the monocrystalline silicon, a dopant may be added to the silicon melt. Examples of the dopant include: an n-type dopant represented by arsenic (As), phosphorus (P), and antimony (Sb); and an n-type dopant represented by boron (B) and aluminum (Al).

The boiling point of the n-type dopant is lower than the melting point of silicon. The n-type dopant is thus likely to evaporate from the surface of the silicon melt in the manufacturing process of the monocrystalline silicon. This makes the concentration of the n-type dopant in the silicon melt lower than a setting value, which may make it difficult for the monocrystalline silicon manufactured to obtain a desired property (e.g., resistivity). In order to inhibit such an inconvenience, the pressure in the chamber is set to be higher than a low pressure of thousands of Pa when the n-type dopant is added to the silicon melt.

However, the pressure in the chamber has been conventionally set to a low pressure of thousands of Pa to inhibit the evaporant evaporated from the surface of the silicon melt from reaching the inner wall surface of the chamber. Setting the pressure in the chamber higher increases the concentration of the evaporant in the exhaust pipe. In this case, the amount of the deposits on the inner wall surface of the exhaust pipe is larger than a case where no dopant is added and a case where a p-type dopant is added. This further increases the possibility of the above (1) to (4) problems.

In this regard, in the atmosphere introduction step of the conventional deposit removing method, the deposits adhering to the inner wall of the exhaust pipe come into contact only with a small amount of oxygen in the atmosphere. Thus, only the surfaces of the deposits combust, which may leave a lot of non-combusted deposits thereon. Further, the deposits with a large thickness firmly adhere to the inner wall of the exhaust pipe, and thus the deposits may not be removed sufficiently only through the atmosphere introduction step. Furthermore, if the atmosphere exhaust step is performed in a state where a lot of non-combusted deposits are exposed, spontaneous combustion or dust explosion may be caused by rapidly supplying oxygen ($O_2$) to the non-combusted deposits due to the pressure fluctuation.

The invention is made in light of the above circumstances, and solving the above problems is an example of the problem(s) to be solved by the invention. An object of the invention is to provide a deposit removing device and a deposit removing method that can solve the problems.

Means for Solving the Problems

In order to solve the problem, a deposit removing device according to an aspect of the invention relates to a deposit removing device configured to remove a deposit adhering to an exhaust pipe through which gas is exhausted from a chamber that manufactures a semiconductor crystal, the device including: a valve configured to open and close an exhaust outlet that communicates with the exhaust pipe; an isolated space forming portion configured to store the valve, into which an inert gas is introduceable, and configured to isolate the exhaust outlet from an outside; a first driving portion configured to drive the valve; and an exhaust outlet opening/closing portion including a second driving portion configured to drive at least part of the isolated space forming portion, in which the valve is driven by the first driving portion to open and close the exhaust outlet, and the at least part of the isolated space forming portion is driven by the second driving portion to introduce the atmosphere into the isolated space forming portion.

With the arrangement, the deposit adhering to the exhaust pipe is preferably removed in a state where the chamber is opened to the atmosphere.

With the arrangement, the exhaust outlet is preferably closed by bringing the valve into contact with a base plate surface formed having the exhaust outlet, and the exhaust outlet is preferably opened by causing the valve to separate from the base plate surface.

A deposit removing method according to an aspect of the invention relates to a deposit removing method for removing a deposit that adheres to an exhaust pipe through which gas is exhausted from a chamber that manufactures a semiconductor crystal, the method including: isolating an exhaust outlet that communicates with the exhaust pipe from an outside to form an isolated space; introducing an inert gas into the isolated space; and opening the exhaust outlet in a state where the deposit is sucked from an outside of the chamber via the exhaust pipe.

In the deposit removing method according to the above aspect of the invention, the deposit adhering to the exhaust pipe is preferably removed in a state where the chamber is opened to the atmosphere.

In the deposit removing method according to the above aspect of the invention, the exhaust outlet is preferably closed by bringing a valve into contact with a base plate surface formed having the exhaust outlet, and the exhaust outlet is opened by causing the valve to separate from the base plate surface.

According to the above aspects of the invention, the deposit can be removed as appropriate while inhibiting combustion of the deposit adhering to the inner wall of the exhaust pipe, at the time of manufacturing the monocrystalline silicon doped with the n-type dopant.

BRIEF EXPLANATION OF DRAWINGS

FIG. 7 is a timing chart for an example of the deposit removing method according to the first exemplary embodiment of the invention.

DESCRIPTION OF EMBODIMENT(S)

Figure 1:
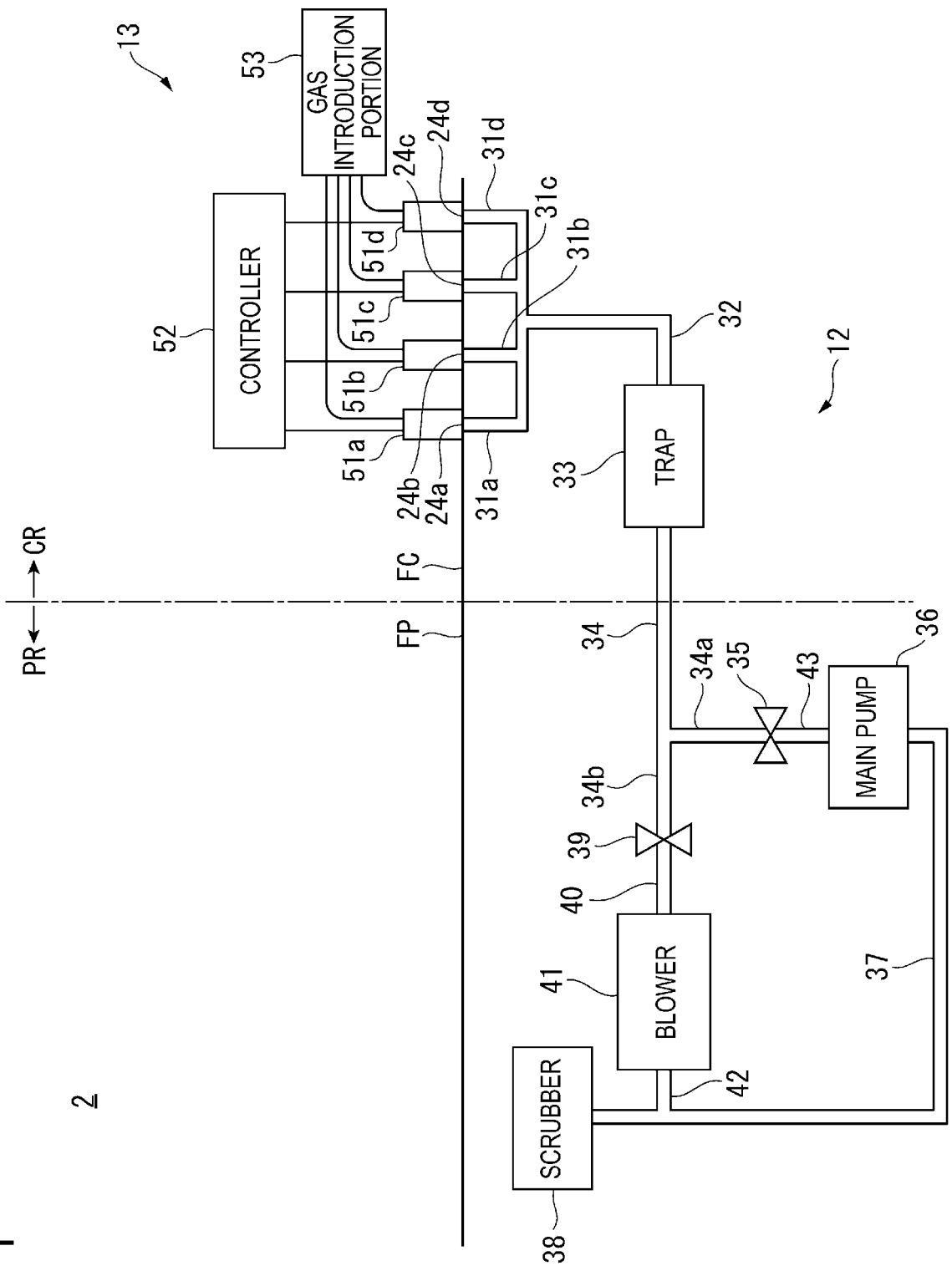
FIG. 1 is a schematic view illustrating an exemplary configuration of a deposit removing device according to a first exemplary embodiment of the invention.

Referring to the drawings, exemplary embodiments of the invention are described below.

First Exemplary Embodiment

Figure 2:
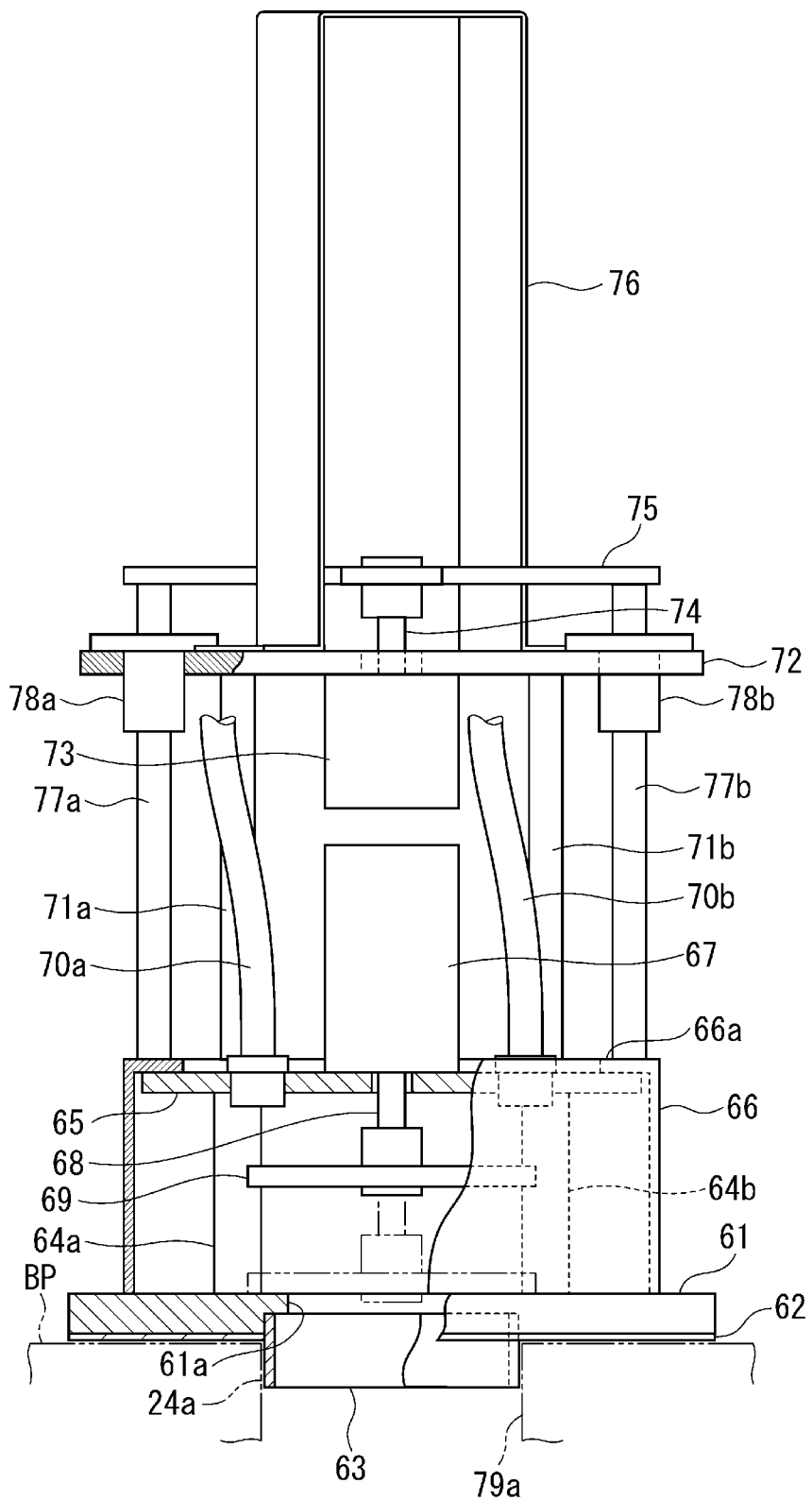
FIG. 2 is a front view showing an exemplary configuration of an exhaust outlet opening/closing portion of the deposit removing device shown in FIG. 1.
Figure 3:
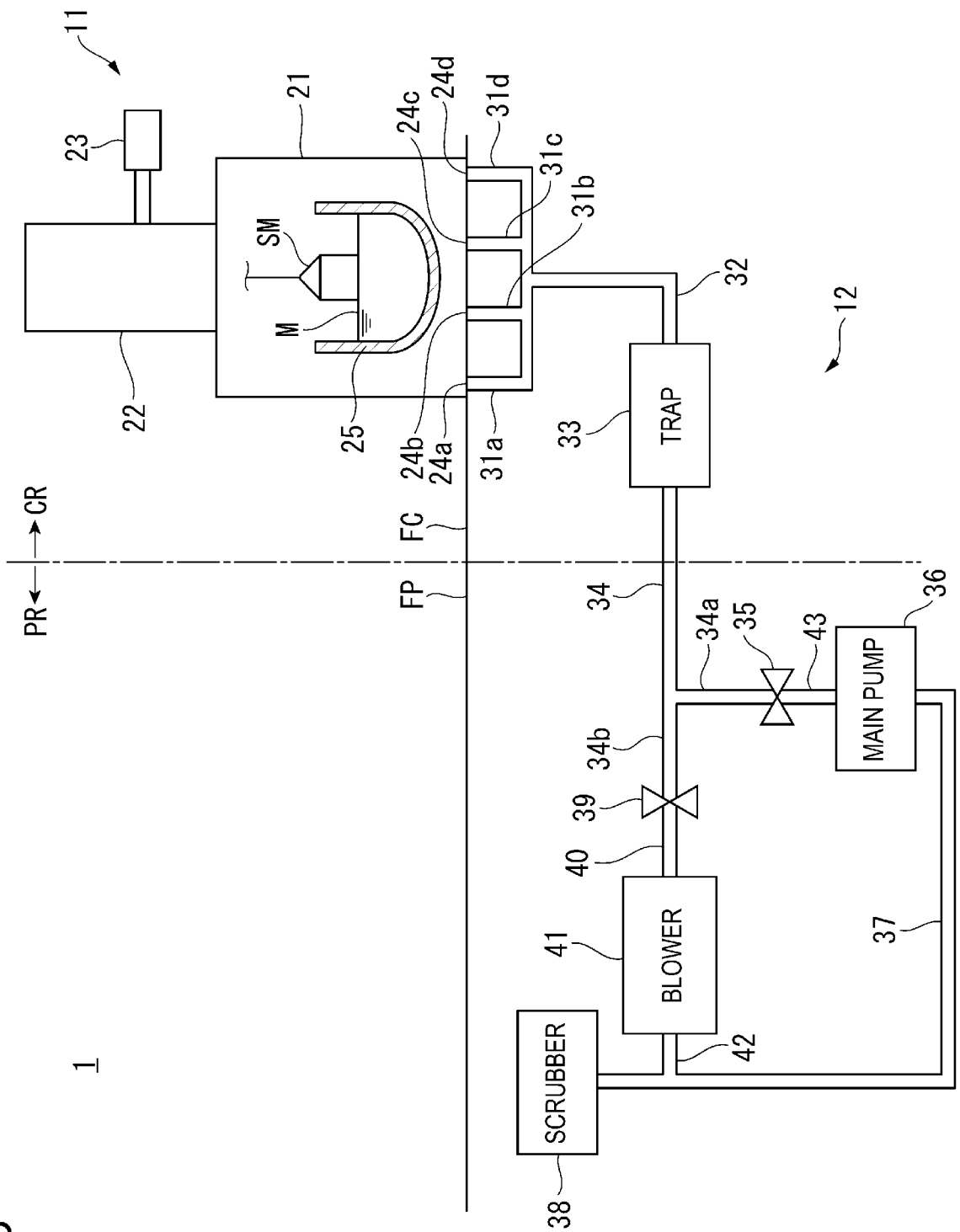
FIG. 3 is a schematic view illustrating an exemplary configuration of a semiconductor crystal manufacturing device that includes the deposit removing device shown in FIG. 1.

FIG. 1 is a schematic view illustrating an exemplary configuration of a deposit removing device 2 according to a first exemplary embodiment of the invention. FIG. 2 is a front view of an exemplary configuration of an exhaust outlet opening/closing portion 51a of the deposit removing device 2. FIG. 3 is a schematic view illustrating an exemplary configuration of a semiconductor crystal manufacturing device 1 that includes the deposit removing device 2.

Referring to FIG. 3, the exemplary configuration of the semiconductor crystal manufacturing device 1 is explained first. The semiconductor crystal manufacturing device 1 manufactures monocrystalline (single-crystal) silicon using a CZ method. The semiconductor crystal manufacturing device 1 includes a semiconductor crystal manufacturing unit 11 and a gas exhaust unit 12.

The semiconductor crystal manufacturing unit 11 is placed on a floor FC of a clean room CR. The semiconductor crystal manufacturing unit 11 includes a hollow chamber 21 of which upper and lower ends are open, a single crystal pulling portion 22 connected to the upper end of the chamber 21, and a gas introduction portion 23 for introducing the atmosphere and/or an inert gas into the chamber 21. The chamber 21 accommodates a substantially cylindrical crucible 25 with a closed bottom that stores a silicon melt M. Although not shown in FIG. 3, the chamber 21 accommodates a driving unit that moves the crucible 25 upward and downward while rotating the crucible 25, a heater that is disposed outside the crucible 25 at a predetermined interval to heat the silicon melt M, and a thermal insulation cylinder disposed outside the heater at a predetermined interval. The single crystal pulling portion 22 immerses a seed crystal (not shown) in the silicon melt M stored in the crucible 25, and then pulls up a monocrystalline silicon SM while rotating the monocrystalline silicon SM in a predetermined direction.

A base plate BP (see FIGS. 2 and 4), which is a bottom portion of the chamber 21 and is placed on the floor FC, is formed having a plurality of exhaust outlets 24 through which the atmosphere and/or inert gas introduced into the chamber 21 is/are exhausted outside. In the first exemplary embodiment, the plurality of exhaust outlets 24 are provided by four exhaust outlets 24a to 24d. In FIG. 3, the exhaust outlets 24a to 24d are illustrated in a manner to be formed directly in the floor FC and arranged linearly at predetermined intervals. However, the exhaust outlets 24a to 24d are actually formed in an upper surface of the base plate BP in a manner to be substantially symmetric to each other with respect to a center axis of the crucible 25 in a plan view. The same applies to FIG. 1. The upper surface of the base plate BP corresponds to a "base plate surface" according to claim 3 and claim 6 of the invention.

Figure 4:
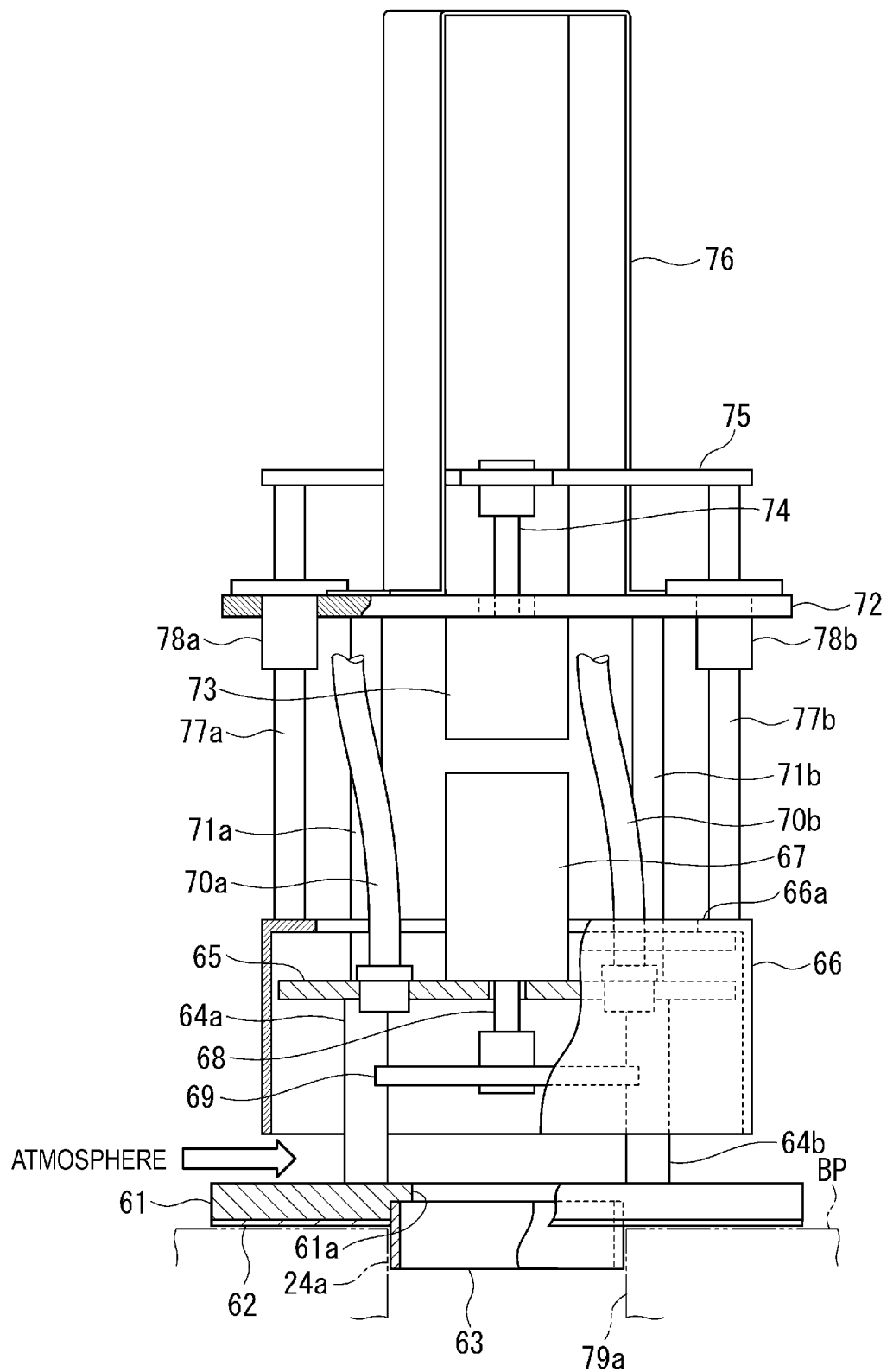
FIG. 4 is a front view showing a state where a sealing cover of the exhaust outlet opening/closing portion of the deposit removing device shown in FIG. 1 is moved upward.

The gas exhaust unit 12 is installed under the floor FC of the clean room CR and a floor FP of a pump chamber PR. A plurality of communication holes 79 are formed in the base plate BP and the floor FC of the clean room CR to pierce therethrough. Upper ends of the communication holes 79 are the exhaust outlets 24a to 24d. The communication holes 79 extend downward in a vertical direction to pierce the floor FC. In the first exemplary embodiment, the plurality of communication holes 79 are provided by four communication holes 79a to 79d. Lower ends of the communication holes 79a to 79d are connected respectively to first ends of four exhaust pipes 31a to 31d extending downward in the vertical direction. Only the communication hole 79a is shown in FIGS. 2 and 4, and illustration of the communication holes 79b to 79d is omitted.

Second ends of the exhaust pipes 31a to 31d are connected collectively to a first end of an exhaust pipe 32. A second end of the exhaust pipe 32 is connected to an input end of a trap 33. The trap 33 traps or catches peeled matter that has peeled off inner walls of the exhaust pipes 31a to 31d and has passed through the exhaust pipe 32. An output end of the trap 33 is connected to an end of an exhaust pipe 34.

The exhaust pipe 34 is installed under the floor FC of the clean room CR and the floor FP of the pump chamber PR. The exhaust pipe 34 branches into a branch pipe 34a and a branch pipe 34b under the floor FP of the pump chamber PR. An end of the branch pipe 34a is connected to an input end of a main valve 35 that is opened at the time of manufacturing the monocrystalline silicon and is closed at the time of removing deposits. An output end of the main valve 35 is connected to an input end of a main pump 36 via an exhaust pipe 43. The main pump 36 operates at the time of manufacturing the monocrystalline silicon to suck the inert gas, evaporant, dust, and the like that have passed through the exhaust pipe 43 and to supply them to a scrubber 38 via an exhaust pipe 37. A first end of the exhaust pipe 37 is connected to an output end of the main pump 36, and a second end of the exhaust pipe 37 is connected to the scrubber 38. The scrubber 38 makes deposits, which have passed through the exhaust pipe 37 and an exhaust pipe 42 described below, sludge.

An end of the branch pipe 34b is connected to an input end of a sub-valve 39 that is opened at the time of removing deposits and is closed at the time of manufacturing the monocrystalline silicon. An output end of the sub-valve 39 is connected to an input end of a blower 41 via an exhaust pipe 40. The blower 41 operates at the time of removing deposits to suck the atmosphere, inert gas, dust, deposits, and the like that have passed through the exhaust pipe 40 and to supply them to the scrubber 38 via the exhaust pipes 42 and 37. A first end of the exhaust pipe 42 is connected to an output end of the blower 41, and a second end of the exhaust pipe 42 is connected to a part of the exhaust pipe 37 close to its second end.

Referring to FIGS. 1 and 2, an exemplary configuration of the deposit removing device 2 is explained. Parts or components shown in FIG. 1, which respectively correspond to parts or components shown in FIG. 3, are designated by the same codes or reference numerals, and any explanation therefor is omitted. In FIG. 1, an exhaust outlet opening/closing unit 13 is provided instead of the semiconductor crystal manufacturing unit 11 shown in FIG. 3. That is, the deposit removing device 2 includes the exhaust outlet opening/closing unit 13 and the gas exhaust unit 12. In other words, the deposit removing device 2 is configured by removing the semiconductor crystal manufacturing unit 11 from the floor FC of the clean room CR and installing the exhaust outlet opening/closing unit 13 on the floor FC. The base plate BP of the semiconductor crystal manufacturing unit 11 is left on the floor FC.

The exhaust outlet opening/closing unit 13 includes exhaust outlet opening/closing portions 51a to 51d that open/close the exhaust outlets 24a to 24d corresponding thereto, a controller 52 that controls the exhaust outlet opening/closing portions 51a to 51d, and a gas introduction portion 53 that introduces the inert gas into the exhaust outlet opening/closing portions 51a to 51d. Similar to typical computers, the controller 52 mainly includes an internal storage in which a program for executing processes in accordance with the timing chart shown in FIG. 7 is stored in advance, a memory on which the program is expanded, and a CPU that executes the program. Although operations of the deposit removing device 2 are explained below, specific processes of the controller 52 are not particularly explained.

The gas introduction portion 23 of the semiconductor crystal manufacturing unit 11 may be used as the gas introduction portion 53. In FIG. 1, the gas introduction portion 53 and the exhaust outlet opening/closing portions 51a to 51d are illustrated in a manner to be connected directly to each other using pipes. However, solenoid valves are actually provided between the gas introduction portion 53 and the exhaust outlet opening/closing portions 51a to 51d. The controller 52 opens/closes the solenoid valves.

Since the exhaust outlet opening/closing portions 51a to 51d have the same structure and function, the structure and function of the exhaust outlet opening/closing portion 51a are explained with reference to FIG. 2. A substantially disc-shaped base plate 61 is formed having a substantially cylindrical communication hole 61a that pierces through a center portion of the base plate 61. A substantially disc-shaped gasket 62 is attached to a lower surface of the base plate 61. An outer diameter of the gasket 62 is approximately equal to that of the base plate 61. An upper end of a fitting cylindrical portion 63 having a substantially cylindrical shape is sunk into and attached to an outer circumference of the communication hole 61a of a lower portion of the base plate 61. The fitting cylindrical portion 63 is fitted into the communication hole 79a and the exhaust outlet 24a formed in the base plate BP placed on the floor FC of the clean room CR.

Four lower support columns 64a to 64d stand on an upper surface of the base plate 61 at positions close to the communication hole 61a such that the lower support columns 64a to 64d are symmetric to each other with respect to a center axis of the base plate 61. Only the lower support columns 64a and 64b are shown in FIG. 2. A substantially disc-shaped fixed table 65 is coupled to upper ends of the lower support columns 64a to 64d. A sealing cover 66 having a substantially cylindrical shape is placed on the fixed table 65. An entire lower end and most of an upper end of the sealing cover 66 are open.

The upper openings of the sealing covers 66 are formed so that upper support columns 71a to 71d and pipes 70a to 70d described below can protrude upward. However, an inner diameter of the sealing cover 66 is slightly larger than an outer diameter of the fixed table 65. Thus, a space formed by an inner wall of the sealing cover 66, the upper surface of the base plate 61, and an upper surface of a valve 69 has a sealed state by bringing a lower surface of the sealing cover 66 into contact with an upper surface of the fixed table 65 through an operation of a cylinder 73 described below by which the sealing cover 66 moves downward, and by bringing the valve 69 into contact with a circumferential portion of the exhaust outlet 24a through an operation of a cylinder 67 described below by which the valve 69 moves downward.

That is, the sealing cover 66 is used to form a sealed space in the exhaust outlet 24a. It can be also said that the cover 66 is used to isolate the exhaust outlet 24a from the outside. A wording "isolated space forming portion" is thus used in claim 1.

A communication hole, which has a substantially cylindrical shape, pierces a center portion of the fixed table 65. The cylinder 67 is fitted into the center portion of the fixed table 65 such that a rod 68 of the cylinder 67 protrudes downward from the communication hole beyond an upper surface of the fixed table 65. The substantially disc-shaped valve 69 is coupled horizontally to a lower end of the rod 68. The valve 69 faces the exhaust outlet 24a, and an outer diameter of the valve 69 is slightly larger than an inner diameter of the exhaust outlet 24a. Thus, the exhaust outlet 24a has a closed state by moving the valve 69 downward through an operation of the cylinder 67 by which the rod 68 moves downward, and bringing a lower surface of the valve 69 into contact with the circumferential portion of the exhaust outlet 24a. The exhaust outlet 24a has an open state by moving the valve 69 upward through an operation of the cylinder 67 by which the rod 68 is stored in the cylinder 67.

Four communication holes having a substantially cylindrical shape pierce the fixed table 65 at positions close to the cylinder 67 such that the communication holes are symmetric to each other with respect to a center axis of the cylinder 67. First ends of the four pipes 70a to 70d are fitted into the respective communication holes. Only the pipes 70a and 70b are shown in FIG. 1. Second ends of the pipes 70a to 70d are connected to four output ends of the gas introduction portion 53. That is, the inert gas is supplied from the gas introduction portion 53 to a space formed by the inner wall of the sealing cover 66 and the upper surface of the base plate 61 via each of the pipes 70a to 70d.

The four upper support columns 71a to 71d stand on the upper surface of the fixed table 65 at positions close to the cylinder 67 such that the columns 71a to 71d are symmetric to each other with respect to the center axis of the cylinder 67 and that the columns 71a to 71d are coaxially with the four lower support columns 64a to 64d, respectively. Only the upper support columns 71a and 71b are shown in FIG. 2. An upper attachment plate 72 having substantially a disc shape is coupled to upper ends of the upper support columns 71a to 71d.

A substantially cylindrical communication hole pierces a center portion of the upper attachment plate 72. The cylinder 73 is fitted into the center portion of the upper attachment plate 72 such that a rod 74 of the cylinder 73 protrudes upward from the communication hole beyond an upper surface of the upper attachment plate 72. A substantially cross-shaped connecting plate 75 is coupled to an upper end of the rod 74. A handle 76 is coupled to the upper surface of the upper attachment plate 72 at positions not interfering with upward and downward movement of the connecting plate 75.

Upper ends of four linear shafts 77a to 77d are coupled to the connecting plate 75 at positions close to its four ends. Only the linear shafts 77a and 77b are shown in FIG. 2. Four communication holes having a substantially cylindrical shape pierce the upper attachment plate 72 at positions close to its outer circumferential portion such that the four communication holes are symmetric to each other with respect to a center axis of the cylinder 73 and that the four communication holes correspond to the four linear shafts 77a to 77d.

Four linear bushes 78a to 78d are fitted into the four communication holes. The linear bushes 78a to 78d are substantially cylindrical, and upper ends thereof are formed having open flanges. The linear bushes 78a to 78d are coupled to the upper attachment plate 72 such that lower surfaces of the flanges are brought into contact with an upper surface of the connecting plate 75 and lower ends of the linear bushes 78a to 78d extend downward beyond the connecting plate 75. Only the linear bushes 78a and 78b are shown in FIG. 2.

The linear shafts 77a to 77d are interposed in the linear bushes 78a to 78d corresponding thereto, and lower ends of the linear shafts 77a to 77d are connected to an upper surface of the sealing cover 66. That is, the linear shafts 77a to 77d are fitted in the linear bushes 78a to 78d corresponding thereto to be movable upward and downward. The sealing cover 66 moves upward by moving the connecting plate 75 upward through an operation of the cylinder 73 by which the rod 74 moves upward. This allows the atmosphere to flow into the space formed by the inner wall of the sealing cover 66 and the upper surface of the base pate 61 as shown in FIG. 4.

On the other hand, the connecting plate 75 moves downward by storing the rod 74 in the cylinder 73 through an operation of the cylinder 73. This moves the sealing cover 66 downward, bringing the lower surface of the sealing cover 66 into contact with the upper surface of the fixed table 65. In this situation, the space formed by the inner wall of the sealing cover 66, the upper surface of the base plate 61, and the upper surface of the valve 69 has the sealed state by moving the valve 69 downward through the operation of the cylinder 67 and bringing the valve 69 into contact with the circumferential portion of the exhaust outlet 24a, as shown by a chain double-dashed line in FIG. 2.

Subsequently, operations of the deposit removing device having the above configuration are explained with reference to the drawings. When the monocrystalline silicon is manufactured, the main valve 35 is opened and the sub-valve 39 is closed in the semiconductor crystal manufacturing device 1 shown in FIG. 3. Further, the main pump 36 is operated and the blower 41 is stopped. The semiconductor crystal manufacturing device 1 is operated for a predetermined time in this state, and then the monocrystalline silicon SM manufactured last is taken out of the device 1. The predetermined time is, for example, several hundreds of hours required for manufacturing the monocrystalline silicon ten times.

Figure 5:
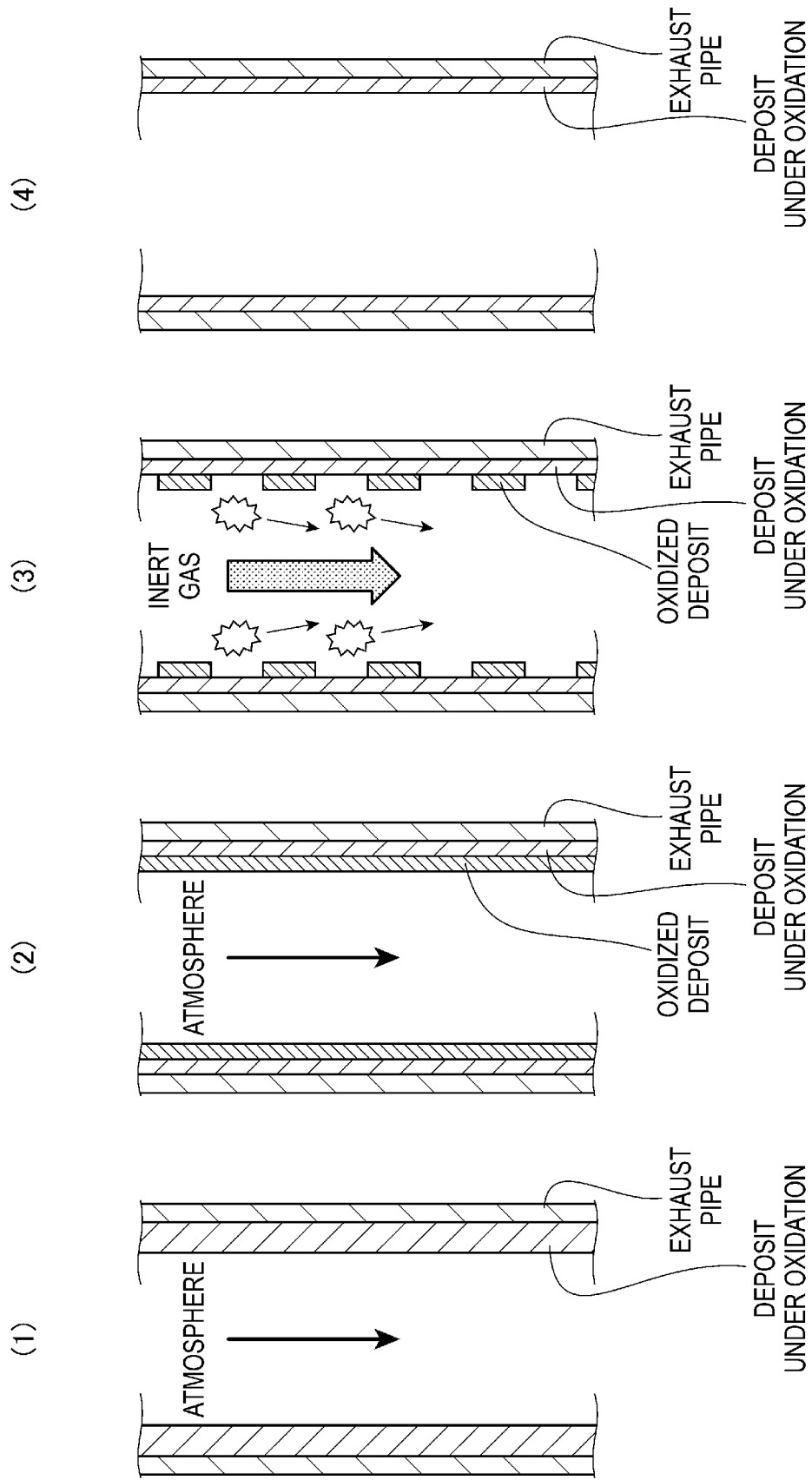
FIG. 5 schematically illustrates an example of a deposit removing method according to a first exemplary embodiment of the invention.

After the elapse of the predetermined time, the main pump 36 is stopped and the main valve 35 is closed. In this state, the semiconductor crystal manufacturing unit 11 is dismantled, leaving the base plate BP. This allows the atmosphere in the clean room CR to flow into the exhaust pipes 31a to 31d through the exhaust outlets 24a to 24d shown in FIG. 3, as shown in FIG. 5(1). FIG. 5(1) schematically illustrates one of the exhaust pipes 31a to 31d. Similarly, FIGS. 5(2) to 5(4) and FIGS. 6(1) to 6(4) schematically illustrate one of the exhaust pipes 31a to 31d.

When the semiconductor crystal manufacturing device 1 is operated for a predetermined time, various kinds of deposits, of which conditions are physically and chemically different from each other, adhere to inner walls of the exhaust pipes. For example, deposits that are different in physical conditions include dust, evaporant that just adhered to the inner wall, and a deposit extracted as a solid after the evaporant adheres to the inner wall. Deposits that are different in chemical conditions include a deposit in which oxidation has proceeded sufficiently and the condition thereof is chemically stable and a deposit in which oxidation is ongoing and the condition thereof is chemically unstable.

Figure 6:
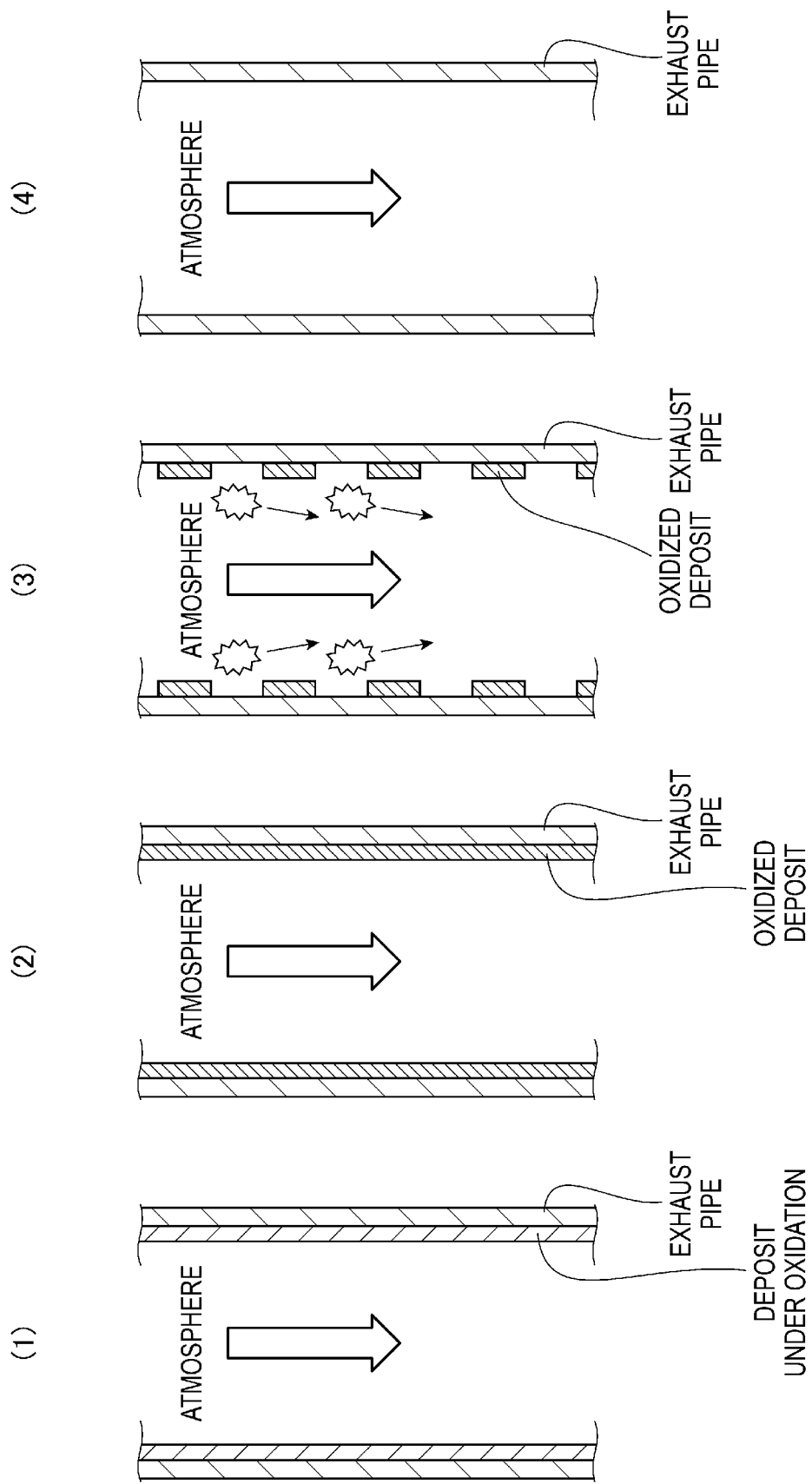
FIG. 6 schematically illustrates another example of the deposit removing method according to the first exemplary embodiment of the invention.

For convenience of the explanation, FIG. 5 and FIG. 6 illustrate only two kinds of deposits, that is, an oxidized deposit and a deposit of which oxidation is ongoing. At this stage, both the main pump 36 and the blower 41 are stopped, and the main valve 35 and the sub-valve 39 are closed. The difference between the pressure in the exhaust pipes 31a to 31d and the atmospheric pressure is thus not large. This allows the atmosphere in the clean room CR to flow gradually or gently into the exhaust pipes 31a to 31d, reducing the possibility of combustion or dust explosion.

After the elapse of a certain time from the state shown in FIG. 5(1), a top surface layer of the deposit under oxidation has a chemically-stable state in which oxidation has proceeded sufficiently, as shown in FIG. 5(2). After the exhaust pipes 31a to 31d have the state shown in FIG. 5(2), the exhaust outlet opening/closing unit 13 is installed as shown in FIG. 1.

That is, a user holds the handle 76 of each of the exhaust outlet opening/closing portions 51a to 51d, and sequentially fits each of the fitting cylindrical portions 63 into the corresponding one of the exhaust outlets 24a to 24d and the corresponding one of the communication holes 79a to 79d. At the time of installing each of the exhaust outlet opening/closing portions 51a to 51d, the valve 69 of each of the exhaust outlet opening/closing portions 51a to 51d is held above as shown by a solid line in FIG. 2. The lower surface of the sealing cover 66 of each of the exhaust outlet opening/closing portions 51a to 51d is brought in contact with the upper surface of the fixed table 65, as shown in FIG. 2.

The installation of the exhaust outlet opening/closing portions 51a to 51d scrapes the deposits adhering to parts of the inner walls of the communication holes 79a to 79d close to the exhaust outlets 24a to 24d, and the scraped deposits fall into the exhaust pipes 31a to 31d. The fallen deposits pass through the exhaust pipes 31a to 31d and the exhaust pipe 32 in this order in the subsequent process, and are caught by the trap 33.

Next, the user connects the exhaust outlet opening/closing portions 51a to 51d and the controller 52, and connects the second ends of the pipes 70a to 70d of the exhaust outlet opening/closing portions 51a to 51d to the respective output ends of the gas introduction portion 53.

Under such a state, a deposit removing process is performed in accordance with the timing chart shown in FIG. 7. In FIG. 7, introducing the inert gas and atmosphere into the exhaust pipes 31a to 31d, operating the blower 41, and moving the sealing covers 66 of the exhaust outlet opening/closing portions 51a to 51d upward (see FIG. 4) are indicated as "ON".

Further, stopping the introduction of the inert gas and atmosphere into the exhaust pipes 31a to 31d, stopping the operation of the blower 41, and moving the sealing covers 66 of the exhaust outlet opening/closing portions 51a to 51d downward so that the lower ends of the covers 66 are brought into contact with the upper end of the base plate 61 (see FIG. 2) are indicated as "OFF". A first opening/closing valve in FIG. 7 corresponds to the valve 69 of the exhaust outlet opening/closing portion 51a. Similarly, second to fourth opening/closing valves in FIG. 7 correspond respectively to the valves 69 of the exhaust outlet opening/closing portions 51b to 51d.

The spaces formed by the inner walls of the sealing covers 66, the upper surface of the base plate 61, and the upper surfaces of the valves 69 have the sealed state by operating the blower 41 in a state where the inert gas and the atmosphere are not introduced and where all the sealing covers 66 of the exhaust outlet opening/closing portions 51a to 51d have a lowered state, and then moving all the valves 69 of the exhaust outlet opening/closing portions 51a to 51d downward at a time Ta shown in FIG. 7 so as to bring the valves 69 into contact with the circumferential portions of the exhaust outlets 24a to 24d.

Subsequently, introduction of the inert gas (e.g., nitrogen ($N_2$) gas) is started at a time Tb shown in FIG. 7. The inert gas has a flow rate of, for example, 200 L/min. This allows the spaces formed by the inner walls of the sealing covers 66 of the exhaust outlet opening/closing portions 51a to 51d, the upper surface of the base plate 61, and the upper surfaces of the valves 69 to be filled with the inert gas. Since the blower 41 operates in a state where the valves 69 are brought into contact with the circumferential portions of the exhaust outlets 24a to 24d, the pressure in the exhaust pipes 31a to 31d becomes negative pressure lower than the atmospheric pressure. Then, as shown in FIG. 7, the first opening/closing valve (i.e., the valve 69 of the exhaust outlet opening/closing portion 51a) moves upward for a period T2, and moves downward. For example, the period T2 is preferably 1 to 2 seconds.

This generates pressure fluctuation of the inert gas in the exhaust pipe 31a. Thus, as shown in FIG. 5(3), the oxidized deposits adhering to the inner wall of the exhaust pipe 31a peel off, and move downstream by air current generated by the introduction of the inert gas and the operation of the blower 41. After the elapse of the periods T2 and T1, as shown in FIG. 7, a second opening/closing valve (i.e., the valve 69 of the exhaust outlet opening/closing portion 51b) moves upward for the period T2, and moves downward.

This generates pressure fluctuation of the inert gas in the exhaust pipe 31b. Thus, as shown in FIG. 5(3), the oxidized deposits adhering to the inner wall of the exhaust pipe 31b peel off, and move downstream by air current generated by the introduction of the inert gas and the operation of the blower 41. The same processes are performed on the third opening/closing valve and the fourth opening/closing valve. The oxidized deposits adhering to the inner walls of the exhaust pipes 31a to 31d are removed as shown in FIG. 5(4) by performing the series of processes described above repeatedly on the first to fourth opening/closing valves a predetermined number of times.

Subsequently, at a time Tc shown in FIG. 7, all the valves 69 of the exhaust outlet opening/closing portions 51a to 51d move upward approximately simultaneously, and all the sealing covers 66 move upward approximately simultaneously. That is, all the exhaust outlet opening/closing portions 51a to 51d have the state shown in FIG. 4. Around the same time as this process, the introduction of the inert gas is stopped. The atmosphere thus flows through lower portions of the sealing covers 66 and the exhaust outlets 24a to 24d, and then is introduced into the exhaust pipes 31a to 31d, as shown in FIG. 6(1).

Since the blower 41 operates at the time Tc, an amount of the atmosphere at the time Tc is larger than that of a state shown in FIG. 5(1). However, the state shown in FIG. 6(1) has a smaller amount of chemically unstable deposits than the state shown in FIG. 5(1) immediately after the monocrystalline silicon is manufactured. This further reduces the possibility of combustion or dust explosion.

After the elapse of a certain time from the state shown in FIG. 6(1), most of the deposits on the exhaust pipes 31a to 31d under oxidation have a chemically stable state in which oxidation has proceeded sufficiently, as shown in FIG. 6(2).

Subsequently, the exhaust outlets 24a to 24d are closed at a time Td shown in FIG. 7, as follows. That is, all the valves 69 of the exhaust outlet opening/closing portions 51a to 51d move downward in a state where all the sealing covers 66 of the exhaust outlet opening/closing portions 51a to 51d have a lifted state, thereby bringing the valves 69 into contact with the circumferential portions of the exhaust outlets 24a to 24d. Since the blower 41 operates, the pressure in each of the exhaust pipes 31a to 31d has negative pressure lower than the atmospheric pressure.

Subsequently, as shown in FIG. 7, the first opening/closing valve (i.e., the valve 69 of the exhaust outlet opening/closing portion 51a) moves upward for a period T4, and then moves downward. For example, the period T4 is preferably 1 to 2 seconds.

This generates pressure fluctuation of the atmosphere in the exhaust pipe 31a. Thus, as shown in FIG. 6(3), most of the oxidized deposits adhering to the inner wall of the exhaust pipe 31a peel off, and move downstream by air current generated by the introduction of the atmosphere and the operation of the blower 41. After the elapse of the periods T3 and T4, as shown in FIG. 7, the second opening/closing valve (i.e., the valve 69 of the exhaust outlet opening/closing portion 51b) moves upward for the period T4, and moves downward.

This generates pressure fluctuation of the atmosphere in the exhaust pipe 31b. Thus, as shown in FIG. 6(3), the oxidized deposits adhering to the inner wall of the exhaust pipe 31b peel off, and move downstream by air current generated by the introduction of the atmosphere and the operation of the blower 41. The same processes are performed on the third opening/closing valve and the fourth opening/closing valve. Most of the oxidized deposits adhering to the inner walls of the exhaust pipes 31a to 31d are removed as shown in FIG. 6(4) by performing the series of processes described above repeatedly on the first to fourth opening/closing valves a predetermined number of times.

As described above, in the first exemplary embodiment according to the invention, the exhaust outlet opening/closing portions 51a to 51d are installed individually in the exhaust outlets 24a to 24d. The exhaust outlet opening/closing portions 51a to 51d individually control not only the opening and closing of the exhaust outlets 24a to 24d but also the introduction of the inert gas or atmosphere into the exhaust pipes 31a to 31d. The invention is thus superior in terms of the following points to a conventional technique in which the inert gas or atmosphere is introduced into exhaust pipes via chambers.

(1) The inert gas can be introduced intensively into the exhaust pipes 31a to 31d via the pipes 70a to 70d and the small-volume sealing covers 66, and the introduction of the inert gas can be stopped in a short time. This generates great pressure fluctuation of the inert gas in the exhaust pipes 31a to 31d, easily removing the deposits with high adhesion strength like the n-type dopant.

(2) The invention only requires that the inside of each of the small-volume sealing covers is filled with the inert gas without using any large-volume chamber, thus reducing a used amount and filling time of the inert gas. It is thus possible to reduce cost and operation time for the deposit removing operation compared to the conventional technique.

(3) The exhaust outlet opening/closing portions 51a to 51d can be placed in the spacious clean room CR after devices and jigs, including chambers, used for manufacturing the monocrystalline silicon are removed. This improves not only operability but also safety, because a user can immediately evacuate if combustion or dust explosion of the deposits occurs.

(4) In the first exemplary embodiment of the invention, the deposits that adhere to the inner walls of the exhaust pipes 31a to 31d and that are chemically unstable immediately after the manufacture of the monocrystalline silicon are removed by the inert gas that contains no oxygen. Thus, combustion or dust explosion is extremely unlikely to occur.

Second Exemplary Embodiment

A first removing step according to the first exemplary embodiment exemplifies a case where the first to fourth opening/closing valves are sequentially opened for a short time and then the first to fourth opening/closing valves are sequentially opened again for a short time, as shown in FIG. 7. The invention, however, is not limited thereto. For example, the first opening/closing valve may be opened a plurality of times for a short time, and then the second to fourth opening/closing valves may be sequentially opened a plurality of times for a short time. Further, an order of the opening and closing of the first to fourth opening/closing valves is not particularly limited.

Third Exemplary Embodiment

The first removing step according to each of the first and second exemplary embodiments exemplifies a case where only one of the opening/closing valves is opened for a short time and then each of the remaining opening/closing valves, except for said one of the opening/closing valves, is sequentially opened for a short time after the elapse of the period T1, as shown in FIG. 7. The invention, however, is not limited thereto. Some or all of the opening/closing valves may be simultaneously opened for a short time before the elapse of the period T1. This can reduce the operation time.

Fourth Exemplary Embodiment

The first exemplary embodiment exemplifies a case where the atmosphere is introduced by moving the sealing covers 66 upward using the cylinders 73. The invention, however, is not limited thereto. For example, the atmosphere may be introduced by moving the fixed table 65 downward. The sealing cover 66 and the fixed table 65 correspond to "at least part of the isolated space forming portion" in claim 1.

Although the exemplary embodiments of the invention have been explained in detail with reference to the drawings, specific configurations thereof are not limited to the exemplary embodiments described above. The invention includes design change or the like within a scope or gist of the invention.

For example, each of the exemplary embodiments exemplifies a case where the semiconductor crystal is the monocrystalline silicon. The invention, however, is not limited thereto. The semiconductor crystal may be silicon polycrystal, GaAs monocrystal, GaAs polycrystal, InP monocrystal, InP polycrystal, ZnS monocrystal, ZnS polycrystal, ZnSe monocrystal, or ZnSe polycrystal. Further, each of the exemplary embodiments exemplifies a case where the invention is applied to manufacture of the semiconductor crystal using the CZ method. The invention, however, is not limited thereto. The invention is applicable to manufacture of the semiconductor crystal using the FZ method.

Each of the exemplary embodiments exemplifies a case where the four exhaust outlets 24a to 24d are formed in the base plate BP placed on the floor FC of the clean room CR and the exhaust outlet opening/closing portions 51a to 51d are installed in the exhaust outlets 24a to 24d respectively. The invention, however, is not limited thereto. The invention is applicable, for example, to a case where two, three, or five or more exhaust outlets are formed in the base plate BP or a side wall(s) of the clean room CR.

Each of the exemplary embodiments exemplifies a case where the cylinders 67 and 73 are used for driving the sealing covers 66 and the valves 69. The invention, however, is not limited thereto. The cylinders 67 and 73 may be air cylinders or hydraulic cylinders. Alternatively, the cylinders 67 and 73 may be replaced with solenoids.

Each of the exemplary embodiments exemplifies a case where the exhaust outlet opening/closing portions 51a to 51d are fitted into the exhaust outlets 24a to 24d formed in the base plate BP. The invention, however, is not limited thereto. The base plate BP may be removed at the time of dismantling the semiconductor crystal manufacturing unit 11, and the exhaust outlet opening/closing portions 51a to 51d may be fitted directly into openings that are formed in the floor FC of the clean room CR and that communicate with the exhaust outlets 24a to 24d.

The exemplary embodiments may be combined or diverted therebetween provided that no contradiction or problem is caused in its purpose and configuration.

The invention claimed is:

1. A deposit removing device configured to remove a deposit adhering to an exhaust pipe through which gas is exhausted from a chamber that manufactures a semiconductor crystal, the device comprising:
   an exhaust outlet opening/closing portion, wherein
   the exhaust outlet opening/closing portion comprises:
   a valve configured to open and close an exhaust outlet that communicates with the exhaust pipe;
   an isolated space forming portion configured to store the valve, into which an inert gas is introduceable, and configured to isolate the exhaust outlet from an outside;
   a first driving portion configured to drive the valve to open and close the exhaust outlet; and
   a second driving portion configured to drive at least part of the isolated space forming portion to introduce atmosphere into the isolated space forming portion.

2. The deposit removing device according to claim 1, wherein the deposit removing device is configured to remove the deposit adhering to the exhaust pipe in a state where the chamber is opened to the atmosphere.

3. The deposit removing device according to claim 1, wherein the deposit removing device is configured such that the exhaust outlet is closed by bringing the valve into contact with a base plate surface formed having the exhaust outlet, and
   the exhaust outlet is opened by causing the valve to separate from the base plate surface.

4. A deposit removing method for removing a deposit that adheres to an exhaust pipe through which gas is exhausted from a chamber that manufactures a semiconductor crystal, the method comprising:
   providing the deposit removing device of claim 1,
   isolating the exhaust outlet that communicates with the exhaust pipe from the outside to form an isolated space;
   introducing the inert gas into the isolated space; and opening the exhaust outlet in a state where the deposit is sucked from an outside of the chamber via the exhaust pipe.

5. The deposit removing method according to claim 4, wherein the deposit adhering to the exhaust pipe is removed in a state where the chamber is opened to the atmosphere.

6. The deposit removing method according to claim 4, wherein the exhaust outlet is closed by bringing a valve into contact with a base plate surface formed having the exhaust outlet, and the exhaust outlet is opened by causing the valve to separate from the base plate surface.

\* \* \* \* \*